(12) United States Patent
Yamaguchi (10) Patent No.: US 11,488,792 B2
(45) Date of Patent: Nov. 1, 2022

(54) GROUNDING CIRCUIT, ELECTRICAL APPARATUS, GROUNDING CONTROL METHOD, AND GROUNDING CONTROL PROGRAM

(71) Applicant: NEC CORPORATION, Tokyo (JP)

(72) Inventor: Shohei Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 348 days.

(21) Appl. No.: 16/630,722

(22) PCT Filed: Aug. 3, 2018

(86) PCT No.: PCT/JP2018/029275
§ 371 (c)(1),
(2) Date: Jan. 13, 2020

(87) PCT Pub. No.: WO2019/031415
PCT Pub. Date: Feb. 14, 2019

(65) Prior Publication Data
US 2021/0090822 A1 Mar. 25, 2021

(30) Foreign Application Priority Data
Aug. 7, 2017 (JP) .............................. JP2017-152656

(51) Int. Cl.
*H01H 9/54* (2006.01)
*H01H 47/00* (2006.01)
*G01R 31/327* (2006.01)

(52) U.S. Cl.
CPC ......... *H01H 9/542* (2013.01); *G01R 31/3278* (2013.01); *H01H 47/002* (2013.01)

(58) Field of Classification Search
CPC ........ H01H 9/542; H01H 9/547; H01H 9/548; H01H 9/56; H01H 47/002; H01H 47/001;
(Continued)

(56) References Cited

U.S. PATENT DOCUMENTS 6,600,643 B2 * 7/2003 Pirovano .............. H01H 47/002
 361/191
7,067,940 B2 * 6/2006 Bianchi .................... H04B 3/44
 307/131
(Continued)

FOREIGN PATENT DOCUMENTS

CN 2181079 Y 10/1994
CN 103490406 A 1/2014
(Continued)

OTHER PUBLICATIONS

Translation of CN 103490406 (Original doc. published Jan. 1, 2014) (Year: 2014).*
(Continued)

*Primary Examiner* — William A Bolton
(74) *Attorney, Agent, or Firm* — Sughrue Mion, PLLC (57) ABSTRACT

The present invention is provided with: a first contact in a first relay connected to a circuit to be grounded; a resistor which is connected between the first contact and the earth, and which suppresses the flow of electric current to the first contact when the first contact is closed; a second contact in a second relay connected in parallel to the resistor; and an interlocking control means which inhibits opening of the first contact in a closed state when the second contact is opened, and which inhibits closing of the first contact in an open state when the second contact is closed.

15 Claims, 6 Drawing Sheets

(58) Field of Classification Search
CPC ...... H01H 47/00; G01R 31/3278; H04B 3/44; H02H 9/02; H02G 9/02
USPC ........................................ 218/143; 200/51.11
See application file for complete search history.

(56) References Cited

U.S. PATENT DOCUMENTS

| | | | | |
|---|---|---|---|---|
| 2008/0123227 A1* | 5/2008 | Bonasia | ................ | H02H 3/338 |
| | | | | 361/49 |
| 2014/0098446 A1* | 4/2014 | Aromin | ................... | H02H 3/16 |
| | | | | 361/42 |
| 2016/0133419 A1* | 5/2016 | Takahashi | ............. | H01H 50/02 |
| | | | | 335/151 |
| 2016/0293365 A1* | 10/2016 | Tanaka | ................. | H01F 7/1805 |
| 2017/0047726 A1* | 2/2017 | Pan | ......................... | H02H 3/33 |
| 2017/0170649 A1* | 6/2017 | Chen | ...................... | H02H 3/334 |

FOREIGN PATENT DOCUMENTS

| | | |
|---|---|---|
| DE | 19513191 C1 | 7/1996 |
| EP | 3467983 A1 | 4/2019 |
| JP | 5-129991 A | 5/1993 |
| JP | 6-104799 A | 4/1994 |
| JP | 2000-341818 A | 12/2000 |
| JP | 2016-103851 A | 6/2016 |

OTHER PUBLICATIONS

Translation of CN2181079(Original doc. published Oct. 26, 1994) (Year: 1994).*
International Search Report for PCT/JP2018/029275 dated, Sep. 4, 2018 (PCT/ISA/210).
Written Opinion of the International Searching Authority for PCT/JP2018/029275 dated, Sep. 4, 2018 (PCT/ISA/237).
Extended European Search Report for EP Application No. EP18843533.3 dated Mar. 16, 2021.
Chinese Office Action for CN Application No. 201880050994.4 dated Aug. 3, 2021 with English Translation.

* cited by examiner

Fig.6B

GROUNDING CIRCUIT, ELECTRICAL APPARATUS, GROUNDING CONTROL METHOD, AND GROUNDING CONTROL PROGRAM

CROSS REFERENCE TO RELATED APPLICATIONS

This application is a National Stage of International Application No. PCT/JP2018/029275 filed Aug. 3, 2018, claiming priority based on Japanese Patent Application No. 2017-152656, filed Aug. 7, 2017.

TECHNICAL FIELD

The present invention relates to a technique of switching the presence or absence of grounding a circuit to be grounded with respect to an earth.

BACKGROUND ART

An undersea cable system includes an undersea cable (hereinafter, referred to as a "cable"), an undersea relay unit, an undersea branching unit (hereinafter, also referred to as a "BU" (branching unit)), a terminal station device (hereinafter, referred to as a "terminal station"), a power supply device, and the like. The undersea relay unit amplifies an attenuated signal. The BU branches a signal toward a plurality of points. The base station performs various data signal transmission and reception. The power supply device supplies electric power to undersea equipment. The power supply device may supply electric power at a high voltage exceeding several kV. Further, the BU may have a function of switching a power supply path to the undersea equipment in order to deal with a ground fault of a cable, corrective maintenance, and the like.

For example, a voltage at a positive electrode is supplied from a terminal station A, and a voltage at a negative electrode is supplied from a terminal station B to the BU. Further, a voltage at a negative electrode is supplied from a terminal station C to the BU. When a power supply path is switched, the BU may ground a part of a circuit of the BU to a sea earth (hereinafter, also referred to as a sea earth ("SE")), or unground the part of the circuit of the BU from the SE.

One example of a branching unit having a function of switching a power supply path is disclosed in PTL 1. In a power supply path switching circuit in PTL 1, a power supply path is switched by supplied electric current. The power supply path switching circuit in PTL 1 includes a first relay, a second relay, a third relay, and a resistor R1. The first relay, the second relay, and the third relay include, respectively, relay coils RL11, RL12, and RL13, and relay switches (relay contacts) r111, r112, and r113. The relay coils RL11, RL12, and RL13 are connected in series, in this order, between a cable terminal 41 and a cable terminal 42. When first predetermined electric current flows through the relay coil RL11, the relay switch r111 disconnects circuits among a cable terminal 43, the cable terminal 41, and the cable terminal 42 by opening (breaking a contact). When second predetermined electric current exceeding the first predetermined electric current flows through the relay coil RL12, the relay switch r112 connects the cable terminal 43 to an earth via the resistor R1 by closing (making a contact). When third predetermined electric current exceeding the second predetermined electric current flows through the relay coil RL13, the relay switch r113 short-circuits the resistor R1 by closing (making a contact).

As a result of the above-described configuration, the power supply path switching circuit in PTL 1 operates as follows.

(1) First, by flowing the first predetermined electric current through the relay coil RL11, the power supply path switching circuit opens the relay switch r111. Consequently, the power supply path switching circuit disconnects circuits among the cable terminal 43, the cable terminal 41, and the cable terminal 42.

(2) Next, by flowing the second predetermined electric current exceeding the first predetermined electric current through the relay coil RL12, the power supply path switching circuit closes the relay switch r112. Consequently, the power supply path switching circuit gradually discharges accumulated electric charge in a cable connected to the cable terminal 43 via the resistor R1 by connecting the cable terminal 43 to the earth via the resistor R1.

(3) Next, by flowing the third predetermined electric current exceeding the second predetermined electric current through the relay coil RL13, the power supply path switching circuit closes the relay switch r113. Consequently, the power supply path switching circuit completely discharges the electric charge charged in the cable at the cable terminal 43 by directly connecting the cable terminal 43 to the earth.

In other words, the power supply path switching circuit in PTL 1 suppresses, when the cable terminal 43 is connected to the earth, large current flowing through the relay switch r112 by the resistor R1.

The power supply path switching circuit in PTL 1 operates as follows, when current flowing through a circuit between the cable terminal 41 and the cable terminal 42 is lowered after the above operations (1) to (3).

(4) First, when electric current flowing through the relay coil RL13 becomes lower than the third predetermined electric current, the power supply path switching circuit opens the relay switch r113.

(5) Next, when electric current flowing through the relay coil RL12 becomes lower than the second predetermined electric current, the power supply path switching circuit opens the relay switch r112.

In the above operation (5), arc discharge occurs in the relay switch r112. As a resistance of the resistor R1 increases, arc discharge is likely to occur in the relay switch r112. Therefore, there is a problem that the power supply path switching circuit in PTL 1 cannot compatibly achieve suppressing large current flowing through the relay switch r112 when being grounded, and suppressing arc discharge in the relay switch r112 when being ungrounded.

PTL 2 describes one example of a technique in which suppressing large current flowing through a relay when being grounded, and suppressing arc discharge in the relay when being ungrounded are compatibly achieved. A grounding circuit in PTL 2 includes a resistor connected between a first relay contact and an earth, and a second relay contact connected in parallel to the resistor. Further, when a device to be grounded (circuit to be grounded) is grounded to the earth, electric current flowing through the first relay contact is suppressed by the resistor. Furthermore, when the circuit to be grounded is ungrounded, the resistor is short-circuited by the second relay contact. Since a voltage at the first relay contact becomes 0V, there is no likelihood that a potential difference occurs between first relay contacts instantaneously when the first relay contact is opened, and arc discharge does not occur at the first relay contact. Therefore, the grounding circuit in PTL 2 suppresses electric current flowing through a relay contact, when the circuit to be grounded is grounded by connection to the relay contact, and also suppresses arc discharge between relay contacts, when the circuit to be grounded is ungrounded by disconnection from the relay contact.

CITATION LIST

Patent Literature

[PTL 1] Japanese Unexamined Patent Application Publication No. H5-129991
[PTL 2] Japanese Patent Application No. 2016-103851

SUMMARY OF INVENTION

Technical Problem

However, in the grounding circuit in PTL 2, in case that an operator inadvertently short-circuits the resistor by the second relay contact when the circuit to be grounded is grounded to the earth, electric current flowing through the first relay contact is not suppressed by the resistor. Further, in the grounding circuit in PTL 2, in case that an operator inadvertently fails to short-circuit the resistor by the second relay contact when the circuit to be grounded is ungrounded, arc discharge occurs in the first relay contact. In other words, there is a problem that the grounding circuit in PTL 2 does not have a fail-safe function regarding an operation of grounding a circuit to be grounded and an operation of ungrounding the circuit to be grounded.

In view of the above-described issue, a main object of the present invention is to provide a fail-safe function regarding an operation of grounding a circuit to be grounded and an operation of ungrounding the circuit to be grounded.

Solution to Problem

In one aspect of the invention, a grounding circuit includes: a first contact in a first relay connected to a circuit to be grounded; a resistor connected between the first contact and an earth, and configured to suppress, when the first contact is closed, electric current flowing through the first contact; a second contact in a second relay connected in parallel to the resistor; and interlocking control means for inhibiting, when the second contact is in an opened state, opening of the first contact in a closed state, and inhibiting, when the second contact is in a closed state, closing of the first contact in an opened state.

In one aspect of the invention, an electrical apparatus includes: a circuit to be grounded; and a grounding circuit including a first contact in a first relay, connected to the circuit to be grounded, a resistor connected between the first contact and an earth, and configured to suppress, when the first contact is closed, electric current flowing through the first contact, a second contact in a second relay, connected in parallel to the resistor, and interlocking control means for inhibiting, when the second contact is in an opened state, opening of the first contact in a closed state, and inhibiting, when the second contact is in a closed state, closing of the first contact in an opened state.

In one aspect of the invention, a grounding control method of a grounding circuit provided with a first contact in a first relay, connected to a circuit to be grounded, a resistor connected between the first contact and an earth, and configured to suppress, when the first contact is closed, electric current flowing through the first contact, and a second contact in a second relay, connected in parallel to the resistor, includes: inhibiting, when the second contact is in an opened state, opening of the first contact in a closed state, and inhibiting, when the second contact is in a closed state, closing of the first contact in an opened state.

In one aspect of the invention, a grounding control program causes a computer provided with a grounding circuit including a first contact in a first relay, connected to a circuit to be grounded, a resistor connected between the first contact and an earth, and configured to suppress, when the first contact is closed, electric current flowing through the first contact, and a second contact in a second relay, connected in parallel to the resistor, to execute processing of inhibiting, when the second contact is in an opened state, opening of the first contact in a closed state, and processing of inhibiting, when the second contact is in a closed state, closing of the first contact in an opened state.

Advantageous Effects of Invention

The present invention provides an advantageous effect being capable of providing a fail-safe function regarding an operation of grounding a circuit to be grounded and an operation of ungrounding the circuit to be grounded.

EXAMPLE EMBODIMENT

In the following, example embodiments according to the present invention are described in detail with reference to the drawings. In all drawings, equivalent components are indicated with the same reference sign, and description thereof is omitted as necessary.

First Example Embodiment

A configuration in the present example embodiment is described.

Figure 1:
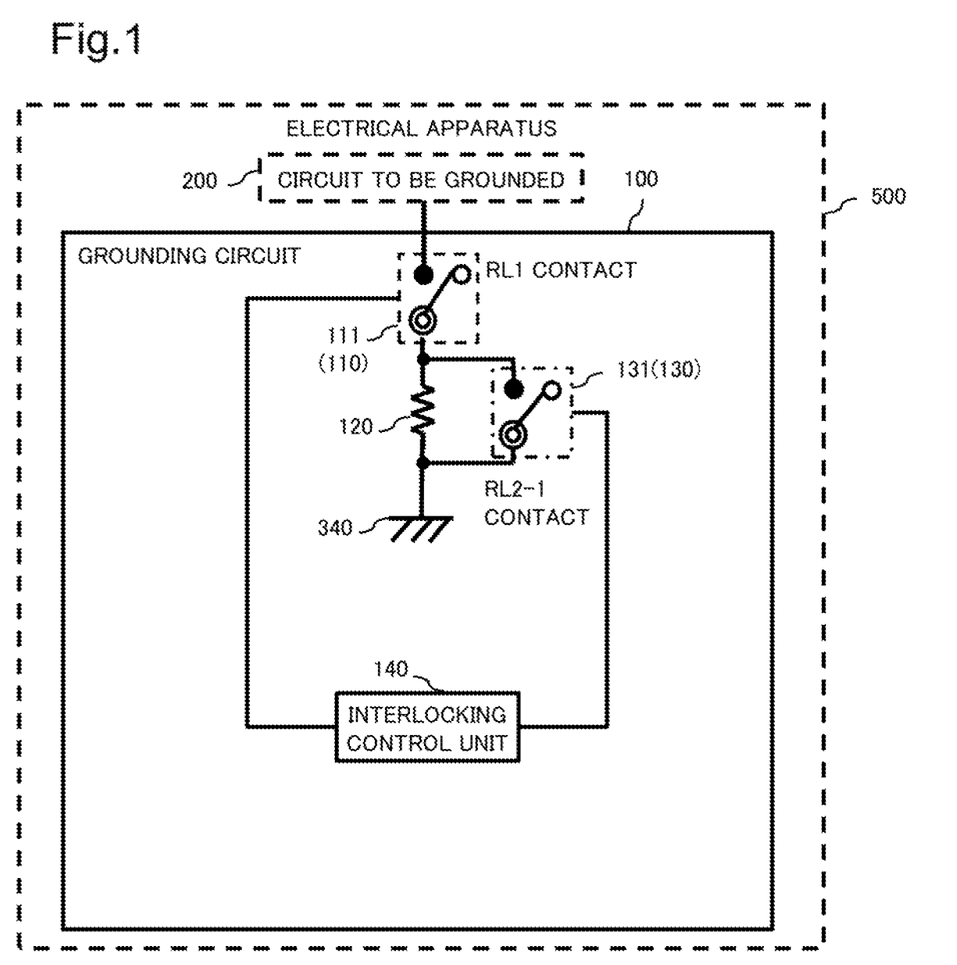
FIG. 1 is a block diagram illustrating one example of a configuration of a grounding circuit according to a first example embodiment of the present invention.

FIG. 1 is a block diagram illustrating one example of a configuration of a grounding circuit according to a first example embodiment of the present invention.

Electrical apparatus 500 includes grounding circuit 100 and circuit to be grounded 200. Although electrical apparatus 500 may be a single apparatus, it may be connected to one or more other apparatuses via a cable or the like. In the latter case, electrical apparatus 500 may communicate with the one or more other apparatuses via the cable or the like, or electric power may be supplied to electrical apparatus 500 from the one or more other apparatuses via the cable or the like. Electrical apparatus 500 may include a sensor, and transmit data measured by the sensor to another apparatus. Electrical apparatus 500 is, for example, a branching unit, an undersea relay unit, a gain equalization device, an undersea seismometer, or a tsunami meter.

Grounding circuit 100 is connected between circuit to be grounded 200 and earth 340.

Earth 340 is, for example, grounding (sea earth) to sea water, or grounding to the earth.

Circuit to be grounded 200 is any electrical circuit for which grounding and ungrounding are necessary.

Grounding circuit 100 includes relay 110 (RL1), resistor 120, relay 130 (RL2), and interlocking control unit 140. In the following, a "relay" is also referred to as "RL".

Relay 110 includes contact 111 (RL1 contact). RL1 contact 111 is a switch for opening and closing a flow path through which controlled electric current flows. RL1 contact 111 is connected to circuit to be grounded 200.

Resistor 120 suppresses, when circuit to be grounded 200 is grounded to earth 340 (when RL1 contact 111 is closed), electric current flowing through RL1 contact 111. One end of resistor 120 is connected to earth 340. The other end of resistor 120 is connected to one end of RL1 contact 111. The other end of RL1 contact 111 is connected to circuit to be grounded 200. The presence or absence of grounding of circuit to be grounded 200 is switched by RL1 contact 111.

Relay 130 includes contact 131 (RL2-1 contact). RL2-1 contact 131 is a switch for opening and closing a flow path through which controlled electric current flows. RL2-1 contact 131 is connected in parallel to resistor 120.

In FIG. 1, it is assumed that a contact of RL1 contact 111 and RL2-1 contact 131 connected to the circuit is indicated by a black circle. Further, it is assumed that a contact that is not connected to the circuit is indicated by a white circle. However, the contact is schematically illustrated, and does not need to be actually present.

Interlocking control unit 140 inhibits, when RL2-1 contact 131 is in an opened state, opening of RL1 contact 111 in a closed state. Further, interlocking control unit 140 inhibits, when RL2-1 contact 131 is in a closed state, closing of RL1 contact 111 in an opened state.

An operation in the present example embodiment is described.

In the following description, an operator of grounding circuit 100 may be a control means, a device, a program, or the like included in electrical apparatus 500, or may be an external control means, device, program, or the like.

First, an operation in a case of grounding circuit to be grounded 200 is described.

(1) First, when RL2-1 contact 131 is in a closed state, an operator opens RL2-1 contact 131.

(2) Next, the operator performs an operation of closing RL1 contact 111. Since RL2-1 contact 131 is in an opened state, interlocking control unit 140 does not inhibit closing of RL1 contact 111. Consequently, grounding circuit 100 connects circuit to be grounded 200 and earth 340 via resistor 120. At this occasion, although large electric current flows through RL1 contact 111 by instantaneous grounding of circuit to be grounded 200 to earth 340, the electric current is suppressed by causing the electric current to flow via resistor 120 between earth 340 and RL1 contact 111.

(3) Subsequently, the operator closes RL2-1 contact 131, after a lapse of time required for termination of inflow of large electric current to RL1 contact 111. Consequently, grounding circuit 100 electrically and directly connects circuit to be grounded 200 and earth 340 without intervening resistor 120.

When the operator does not perform the above operation (1) before the above operation (2), RL2-1 contact 131 is in a closed state. However, interlocking control unit 140 inhibits, when RL2-1 contact 131 is in a closed state, closing of RL1 contact 111 in an opened state. Therefore, since RL1 contact 111 is not closed even when the operator performs the above operation (2), circuit to be grounded 200 and earth 340 are not connected. In other words, even when the operator does not perform the above operation (1) before the above operation (2), there is no likelihood that large electric current flows through RL1 contact 111 by instantaneous grounding of circuit to be grounded 200 to earth 340 without intervening resistor 120. Specifically, grounding circuit 100 has a fail-safe function regarding an operation of grounding circuit to be grounded 200.

Next, an operation in a case of ungrounding circuit to be grounded 200 is described.

(4) First, when RL2-1 contact 131 is in an opened state, the operator closes RL2-1 contact 131.

(5) Next, the operator performs an operation of opening RL1 contact 111. Since RL2-1 contact 131 is in a closed state, interlocking control unit 140 does not inhibit opening of RL1 contact 111. Consequently, circuit to be grounded 200 is ungrounded. At this occasion, when RL1 contact 111 is in a high voltage state, arc discharge occurs in RL1 contact 111 during opening of RL1 contact 111. However, since RL2-1 contact 131 is in a closed state, a voltage of RL1 contact 111 is 0V, and arc discharge does not occur in RL1 contact 111. Therefore, a fault is less likely to occur in RL1 contact 111.

When the operator does not perform the above operation (4) before the above operation (5), RL2-1 contact 131 is in an opened state. However, interlocking control unit 140 inhibits, when RL2-1 contact 131 is in an opened state, opening of RL1 contact 111 in a closed state. Therefore, since RL1 contact 111 is not opened even when the operator performs the above operation (5), circuit to be grounded 200 is not ungrounded. In other words, even when the operator does not perform the above operation (4) before the above operation (5), arc discharge does not occur in RL1 contact 111. Specifically, grounding circuit 100 has a fail-safe function regarding an operation of ungrounding circuit to be grounded 200.

As described above, grounding circuit 100 according to the present example embodiment includes resistor 120 disposed between RL1 contact 111 and earth 340, and RL2-1 contact 131 connected in parallel to resistor 120. Further, when circuit to be grounded 200 is grounded to earth 340, electric current flowing through RL1 contact 111 is suppressed by resistor 120. Further, when circuit to be grounded 200 is ungrounded, resistor 120 is short-circuited by RL2-1 contact 131. Since a voltage of RL1 contact 111 becomes 0V, there is no likelihood that a potential difference occurs between RL1 contacts 111 instantaneously when RL1 contact 111 is opened, and arc discharge does not occur in RL1 contact 111. In other words, grounding circuit 100 according to the present example embodiment suppresses, when circuit to be grounded 200 is grounded by connection to the relay contact, electric current flowing through a relay contact, and also suppresses, when circuit to be grounded 200 is ungrounded by disconnection from the relay contact, arc discharge between relay contacts.

Further, in grounding circuit 100 according to the present example embodiment, interlocking control unit 140 inhibits, when RL2-1 contact 131 is in an opened state, opening of RL1 contact 111 in a closed state. Further, interlocking control unit 140 inhibits, when RL2-1 contact 131 is in a closed state, closing of RL1 contact 111 in an opened state. In other words, since RL1 contact 111 in an opened state is not closed during closing of RL2-1 contact 131, circuit to be grounded 200 is not grounded. Further, since RL1 contact 111 in a closed state is not opened during opening of RL2-1 contact 131, circuit to be grounded 200 is not ungrounded. Therefore, grounding circuit 100 according to the present example embodiment has an advantageous effect of having a fail-safe function regarding an operation of grounding circuit to be grounded 200 and an operation of ungrounding circuit to be grounded 200.

Second Example Embodiment

Next, a second example embodiment according to the present invention on the basis of the first example embodiment according to the present invention is described. An interlocking control unit according to the present example embodiment is achieved by using a relay.

A configuration according to the present example embodiment is described.

Figure 2:
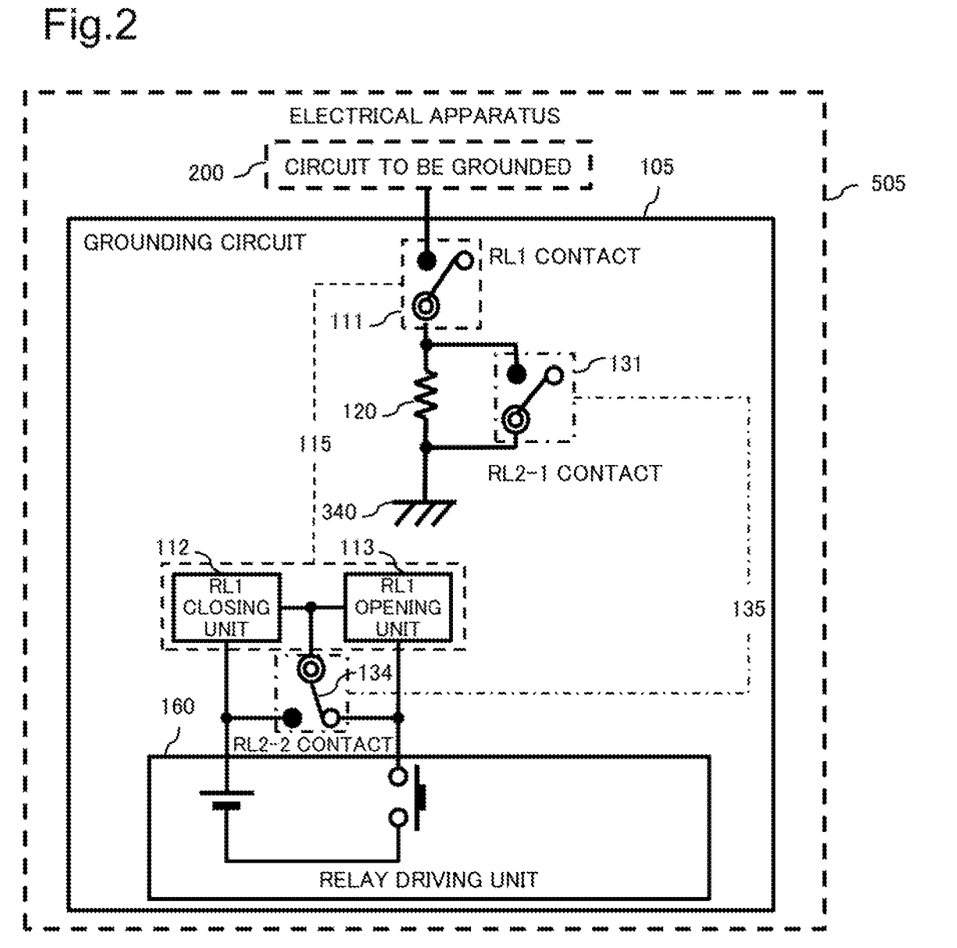
FIG. 2 is a circuit diagram illustrating one example of a configuration of a grounding circuit according to a second example embodiment of the present invention.

FIG. 2 is a circuit diagram illustrating one example of a configuration of a grounding circuit according to the second example embodiment of the present invention.

Electrical apparatus 505 includes grounding circuit 105 and circuit to be grounded 200.

Grounding circuit 105 is connected between circuit to be grounded 200 and earth 340.

Grounding circuit 105 includes relay 115 (RL1), resistor 120, relay 135 (RL2), and relay driving unit 160.

Relay 115 includes RL1 contact 111, RL1 closing unit 112, and RL1 opening unit 113. When electric current is supplied, RL1 closing unit 112 closes RL1 contact 111. When electric current is supplied, RL1 opening unit 113 opens RL1 contact 111. RL1 closing unit 112 and RL1 opening unit 113 are, for example, relay coils. Relay 115 holds an opened state or a closed state (opened/closed state) of RL1 contact 111, which is operated immediately before in a state that electric current is not supplied to RL1 closing unit 112 and RL1 opening unit 113. Specifically, relay 115 is a latching relay (latch relay).

Relay 135 includes RL2-1 contact 131 and contact 134 (RL2-2 contact). RL2-2 contact 134 is a switch for opening and closing a flow path through which controlled electric current other than controlled electric current at RL2-1 contact 131 flows with RL2-1 contact 131 being interlocked.

In FIG. 2, since RL2-2 contact 134 is interlocked with RL2-1 contact 131, it is assumed that a contact of RL2-2 contact 134 to be connected when RL2-1 contact 131 is closed is indicated by a black circle. Further, it is assumed that a contact of RL2-2 contact 134 to be connected when RL2-1 contact 131 is opened is indicated by a white circle.

RL1 opening unit 113 is connected in series to RL1 closing unit 112. When RL2-1 contact 131 is in an opened state, RL2-2 contact 134 short-circuits RL1 opening unit 113. When RL2-1 contact 131 is in a closed state, RL2-2 contact 134 short-circuits RL1 closing unit 112.

Relay driving unit 160 supplies electric current and stops supplying electric current to a circuit where RL1 closing unit 112 and RL1 opening unit 113 are connected in series. In FIG. 2, the above-described function of relay driving unit 160 is schematically illustrated by a power source and a push switch. Actually, however, relay driving unit 160 does not need to include a power source or a push switch.

The other configuration of the present example embodiment is the same as the configuration according to the first example embodiment of the present invention.

An operation according to the present example embodiment is described.

First, an operation in a case of grounding circuit to be grounded 200 is described.

(1) First, when RL2-1 contact 131 is in a closed state, an operator opens RL2-1 contact 131. Consequently, since RL2-2 contact 134 is interlocked with opening of RL2-1 contact 131, RL2-2 contact 134 short-circuits RL1 opening unit 113.

(2) Next, the operator performs an operation of closing RL1 contact 111. Since RL1 opening unit 113 is short-circuited by RL2-2 contact 134, electric current is supplied to RL1 closing unit 112. Consequently, grounding circuit 105 connects circuit to be grounded 200 and earth 340 via resistor 120 by closing RL1 contact 111. At this occasion, although large electric current flows through RL1 contact 111 by instantaneous grounding of circuit to be grounded 200 to earth 340, the electric current is suppressed by causing the electric current to flow via resistor 120 between earth 340 and RL1 contact 111.

(3) Subsequently, the operator closes RL2-1 contact 131, after a lapse of time required for termination of inflow of large electric current to RL1 contact 111. Consequently, grounding circuit 105 electrically and directly connects circuit to be grounded 200 and earth 340 without intervening resistor 120.

When the operator does not perform the above operation (1) before the above operation (2), RL2-1 contact 131 is in a closed state. However, by RL2-2 contact 134 interlocked with RL2-1 contact 131, RL1 closing unit 112 is short-circuited. Therefore, even when the operator performs the above operation (2), electric current is not supplied to RL1 closing unit 112. Consequently, since RL1 contact 111 is not closed, circuit to be grounded 200 and earth 340 are not connected. In other words, even when the operator does not perform the above operation (1) before the above operation (2), there is no likelihood that large electric current flows through RL1 contact 111 by instantaneous grounding of circuit to be grounded 200 to earth 340 without intervening resistor 120. In case that RL2-2 contact 134 is not present when RL1 contact 111 is closed without opening RL2-1 contact 131 due to an inadvertent operation of an operator, a program error, or the like, for example, excessive electric current may flow through the two contacts, and the contact may become defective. However, when RL2-2 contact 134 interlocked with RL2-1 contact 131 is present, it is possible to prevent excessive electric current. Specifically, grounding circuit 105 has a fail-safe function regarding an operation of grounding circuit to be grounded 200.

Next, an operation in a case of ungrounding circuit to be grounded 200 is described.

(4) First, when RL2-1 contact 131 is in an opened state for some reason, the operator closes RL2-1 contact 131. Consequently, since RL2-2 contact 134 is interlocked with opening of RL2-1 contact 131, RL2-2 contact 134 short-circuits RL1 closing unit 112.

(5) Next, the operator performs an operation of opening RL1 contact 111. Since RL1 closing unit 112 is short-circuited by RL2-2 contact 134, electric current is supplied to RL1 opening unit 113. Consequently, grounding circuit 105 opens RL1 contact 111, and circuit to be grounded 200 is ungrounded. At this occasion, when RL1 contact 111 is in a high voltage state, arc discharge occurs in RL1 contact 111 during opening of RL1 contact 111. However, since RL2-1 contact 131 is in a closed state, a voltage of RL1 contact 111 is 0V, and arc discharge does not occur in RL1 contact 111. Therefore, a fault is less likely to occur in RL1 contact 111.

When the operator does not perform the above operation (4) before the above operation (5), RL2-1 contact 131 is in an opened state. However, by RL2-2 contact 134 interlocked with RL2-1 contact 131, RL1 opening unit 113 is short-circuited. Therefore, even when the operator performs the above operation (5), electric current is not supplied to RL1 opening unit 113. Consequently, since RL1 contact 111 is not opened, circuit to be grounded 200 is not ungrounded. In other words, even when the operator does not perform the above operation (4) before the above operation (5), arc discharge does not occur in RL1 contact 111. Specifically, grounding circuit 105 has a fail-safe function regarding an operation of ungrounding circuit to be grounded 200.

As described above, grounding circuit 105 according to the present example embodiment includes resistor 120 disposed between RL1 contact 111 and earth 340, and RL2-1 contact 131 connected in parallel to resistor 120. Further, when circuit to be grounded 200 is grounded to earth 340, electric current flowing through RL1 contact 111 is suppressed by resistor 120. Further, when circuit to be grounded 200 is ungrounded, resistor 120 is short-circuited by RL2-1 contact 131. Since a voltage of RL1 contact 111 becomes 0V, there is no likelihood that a potential difference occurs between RL1 contacts 111 instantaneously when RL1 contact 111 is opened, and arc discharge does not occur in RL1 contact 111. In other words, grounding circuit 105 according to the present example embodiment suppresses, when circuit to be grounded 200 is grounded by connection to the relay contact, electric current flowing through a relay contact, and also suppresses, when circuit to be grounded 200 is ungrounded by disconnection from the relay contact, arc discharge between relay contacts.

Further, in grounding circuit 105 according to the present example embodiment, RL1 opening unit 113 is connected in series to RL1 closing unit 112. Further, RL2-2 contact 134 short-circuits RL1 opening unit 113, when RL2-1 contact 131 is in an opened state. On the other hand, when RL2-1 contact 131 is in a closed state, RL2-2 contact 134 short-circuits RL1 closing unit 112. In other words, since RL1 contact 111 is not closed during closing of RL2-1 contact 131, circuit to be grounded 200 is not grounded. Further, since RL1 contact 111 is not opened during opening of RL2-1 contact 131, circuit to be grounded 200 is not ungrounded. Therefore, grounding circuit 105 according to the present example embodiment has an advantageous effect of having a fail-safe function regarding an operation of grounding circuit to be grounded 200 and an operation of ungrounding circuit to be grounded 200.

Third Example Embodiment

Next, a third example embodiment according to the present invention on the basis of the second example embodiment according to the present invention is described. A relay driving unit according to the present example embodiment controls an opened/closed state of RL2.

A configuration according to the present example embodiment is described.

Figure 3:
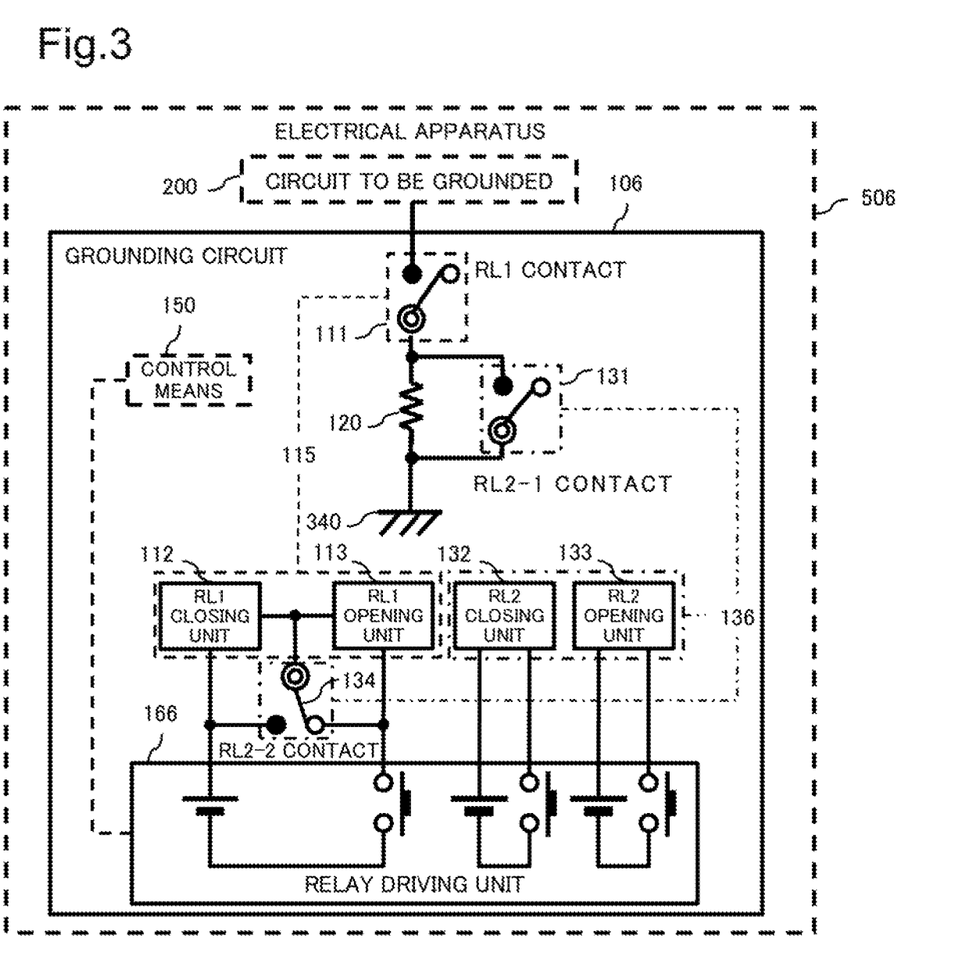
FIG. 3 is a circuit diagram illustrating one example of a configuration of a grounding circuit according to a third example embodiment of the present invention.

FIG. 3 is a circuit diagram illustrating one example of a configuration of a grounding circuit according to the third example embodiment of the present invention.

Electrical apparatus 506 includes grounding circuit 106 and circuit to be grounded 200.

Grounding circuit 106 is connected between circuit to be grounded 200 and earth 340.

Grounding circuit 106 includes relay 115, resistor 120, relay 136, and relay driving unit 166. Grounding circuit 106 may further include control means 150.

Relay 136 includes RL2-1 contact 131, RL2-2 contact 134, RL2 closing unit 132, and RL2 opening unit 133. When electric current is supplied, RL2 closing unit 132 closes RL2-1 contact 131, and short-circuits RL1 closing unit 112 (also referred to as "closes RL2-2 contact 134"). When electric current is supplied, RL2 opening unit 133 opens RL2-1 contact 131, and short-circuits RL1 opening unit 113 (also referred to as "opens RL2-2 contact 134"). RL2 closing unit 132 and RL2 opening unit 133 are, for example, relay coils. Relay 136 holds an opened state or a closed state of RL2-1 contact 131 and RL2-2 contact 134, which are operated immediately before in a state that electric current is not supplied to RL2 closing unit 132 and RL2 opening unit 133. Specifically, relay 136 is a latching relay.

Relay driving unit 166 supplies electric current and stops supplying electric current to a circuit where RL1 closing unit 112 and RL1 opening unit 113 are connected in series. Further, relay driving unit 166 supplies electric current and stops supplying electric current to RL2 closing unit 132. Furthermore, relay driving unit 166 supplies electric current and stops supplying electric current to RL2 opening unit 133. In FIG. 3, the above-described function of relay driving unit 166 is schematically illustrated by a power source and a push switch. Actually, however, relay driving unit 166 does not need to include a power source or a push switch. Relay driving unit 166 may be controlled by control means 150 provided inside or outside electrical apparatus 506.

Control means 150 controls opening and closing of RL1 contact 111 and RL2-1 contact 131 via relay driving unit 166, based on a control signal. The control signal may be received from circuit to be grounded 200, or may be received from another device via circuit to be grounded 200.

The other configuration of the present example embodiment is the same as the configuration according to the second example embodiment of the present invention.

An operation according to the present example embodiment is described.

Figure 4A:
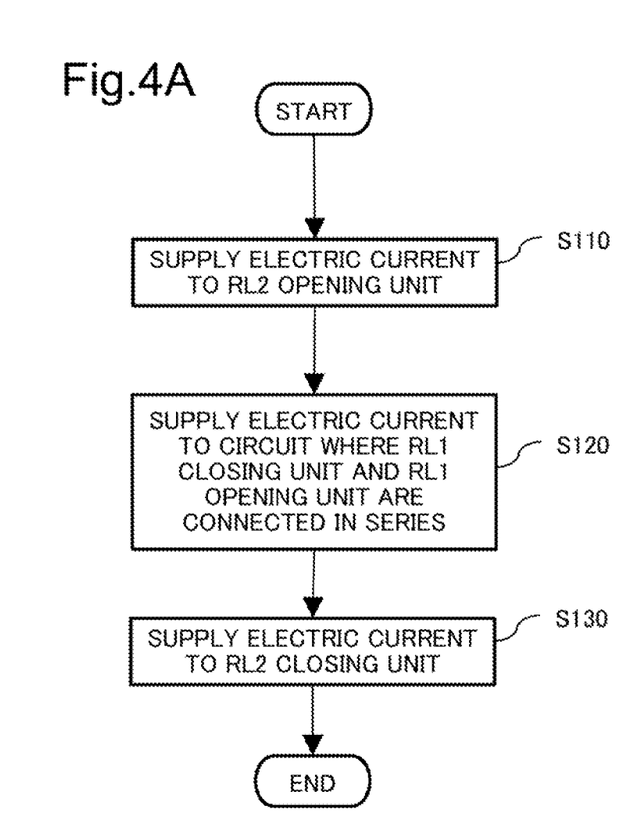
FIG. 4A is flowchart illustrating an operation of the grounding circuit according to the third example embodiment of the present invention.
Figure 4B:
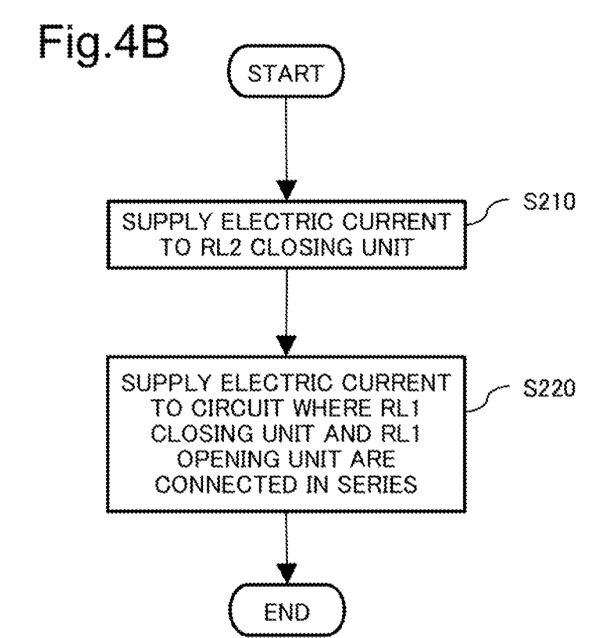
FIG. 4B is flowchart illustrating an operation of the grounding circuit according to the third example embodiment of the present invention.

Each of FIGS. 4A and 4B is a flowchart illustrating an operation of a grounding circuit according to the third example embodiment of the present invention. Specifically, FIG. 4A illustrates an operation, when an operator grounds circuit to be grounded 200, and FIG. 4B illustrates an operation, when the operator ungrounds circuit to be grounded 200. It is assumed that the operator operates grounding circuit 106 via relay driving unit 166. Further, the operator may be a control means, a device, a program, or the like included in grounding circuit 106, or may be an external control means, device, program, or the like. The flowchart illustrated in FIGS. 4A and 4B and the following description are one example. A processing order or the like may be interchanged, processing may be returned, or processing may be repeated according to processing to be required as necessary.

First, an operation in a case of grounding circuit to be grounded 200 is described.

(1) First, the operator supplies electric current to RL2 opening unit 133 via relay driving unit 166 (Step S110).

Consequently, grounding circuit 106 opens RL2-1 contact 131, and short-circuits RL1 opening unit 113 by RL2-2 contact 134.

(2) Next, the operator supplies electric current to a circuit where RL1 closing unit 112 and RL1 opening unit 113 are connected in series via relay driving unit 166 (Step S120). Since RL1 opening unit 113 is short-circuited by RL2-2 contact 134, electric current is supplied to RL1 closing unit 112. Consequently, by closing RL1 contact 111, grounding circuit 106 connects circuit to be grounded 200 and earth 340 via resistor 120. At this occasion, although large electric current flows through RL1 contact 111 by instantaneous grounding of circuit to be grounded 200 to earth 340, the electric current is suppressed by causing the electric current to flow via resistor 120 between earth 340 and RL1 contact 111.

(3) Subsequently, the operator supplies electric current to RL2 closing unit 132 via relay driving unit 166, after a lapse of time required for termination of inflow of large electric current to RL1 contact 111 (Step S130). Then, RL2-1 contact 131 is closed, and grounding circuit 106 electrically and directly connects circuit to be grounded 200 and earth 340 without intervening resistor 120.

When the operator does not perform the above operation (1) before the above operation (2), RL2-1 contact 131 is in a closed state. However, by RL2-2 contact 134 interlocked with RL2-1 contact 131, RL1 closing unit 112 is short-circuited. Therefore, even when the operator performs the above operation (2), electric current is not supplied to RL1 closing unit 112. Consequently, since RL1 contact 111 is not closed, circuit to be grounded 200 and earth 340 are not connected. In other words, even when the operator does not perform the above operation (1) before the above operation (2), there is no likelihood that large electric current flows through RL1 contact 111 by instantaneous grounding of circuit to be grounded 200 to earth 340 without intervening resistor 120. In case that RL2-2 contact 134 is not present when RL1 contact 111 is closed without opening RL2-1 contact 131 due to an inadvertent operation of an operator, a program error, or the like, for example, excessive electric current may flow through the two contacts, and the contact may become defective. However, with RL2-2 contact 134 interlocked with RL2-1 contact 131, it is possible to prevent excessive electric current. Specifically, grounding circuit 106 has a fail-safe function regarding an operation of grounding circuit to be grounded 200.

Next, an operation in a case of ungrounding circuit to be grounded 200 is described.

(4) First, when RL2-1 contact 131 is in an opened state for some reason, the operator supplies electric current to RL2 closing unit 132 via relay driving unit 166 (Step S210). Consequently, grounding circuit 106 short-circuits resistor 120 by closing RL2-1 contact 131, and short-circuits RL1 closing unit 112 by RL2-2 contact 134.

(5) Next, the operator supplies electric current to a circuit where RL1 closing unit 112 and RL1 opening unit 113 are connected in series via relay driving unit 166 (Step S220). Since RL1 closing unit 112 is short-circuited by RL2-2 contact 134, electric current is supplied to RL1 opening unit 113. Consequently, grounding circuit 106 opens RL1 contact 111, and circuit to be grounded 200 is ungrounded. At this occasion, when RL1 contact 111 is in a high voltage state, arc discharge occurs in RL1 contact 111 during opening of RL1 contact 111. However, since RL2-1 contact 131 is in a closed state, a voltage of RL1 contact 111 is 0V, and arc discharge does not occur in RL1 contact 111. Therefore, a fault is less likely to occur in RL1 contact 111.

When the operator does not perform the above operation (4) before the above operation (5), RL2-1 contact 131 is in an opened state. However, by RL2-2 contact 134 interlocked with RL2-1 contact 131, RL1 opening unit 113 is short-circuited. Therefore, even when the operator performs the above operation (5), electric current is not supplied to RL1 opening unit 113. Consequently, since RL1 contact 111 is not opened, circuit to be grounded 200 is not ungrounded. In other words, even when the operator does not perform the above operation (4) before the above operation (5), arc discharge does not occur in RL1 contact 111. Specifically, grounding circuit 106 has a fail-safe function regarding an operation of ungrounding circuit to be grounded 200.

As described above, grounding circuit 106 according to the present example embodiment includes resistor 120 disposed between RL1 contact 111 and earth 340, and RL2-1 contact 131 connected in parallel to resistor 120. Further, when circuit to be grounded 200 is grounded to earth 340, electric current flowing through RL1 contact 111 is suppressed by resistor 120. Furthermore, when circuit to be grounded 200 is ungrounded, resistor 120 is short-circuited by RL2-1 contact 131. Since a voltage of RL1 contact 111 becomes 0V, there is no likelihood that a potential difference occurs between RL1 contacts 111 instantaneously when RL1 contact 111 is opened, and arc discharge does not occur in RL1 contact 111. In other words, grounding circuit 106 according to the present example embodiment suppresses, when circuit to be grounded 200 is grounded by connection to the relay contact, electric current flowing through a relay contact, and also suppresses, when circuit to be grounded 200 is ungrounded by disconnection from the relay contact, arc discharge between relay contacts.

Further, in grounding circuit 106 according to the present example embodiment, RL1 opening unit 113 is connected in series to RL1 closing unit 112. Furthermore, when RL2-1 contact 131 is in an opened state, RL2-2 contact 134 short-circuits RL1 opening unit 113. On the other hand, when RL2-1 contact 131 is in a closed state, RL2-2 contact 134 short-circuits RL1 closing unit 112. In other words, since RL1 contact 111 is not closed during closing of RL2-1 contact 131, circuit to be grounded 200 is not grounded. Further, since RL1 contact 111 is not opened during opening of RL2-1 contact 131, circuit to be grounded 200 is not ungrounded. Therefore, grounding circuit 106 according to the present example embodiment has an advantageous effect of having a fail-safe function regarding an operation of grounding circuit to be grounded 200 and an operation of ungrounding circuit to be grounded 200.

Fourth Example Embodiment

Next, a fourth example embodiment according to the present invention on the basis of the third example embodiment according to the present invention is described. According to the present example embodiment, an electrical apparatus is a branching unit, and an earth is a sea earth.

A configuration according to the present example embodiment is described.

Figure 5:
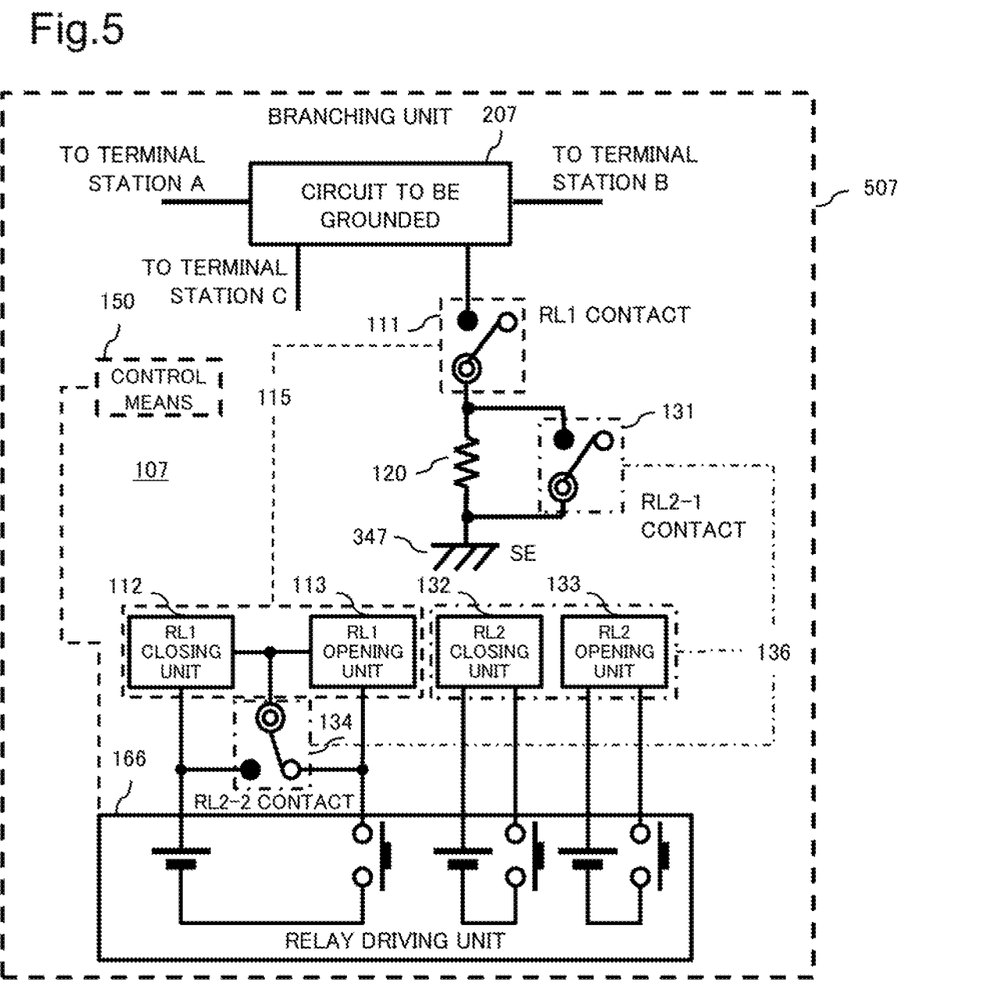
FIG. 5 is a circuit diagram illustrating one example of a configuration of a grounding circuit according to a fourth example embodiment of the present invention.

FIG. 5 is a circuit diagram illustrating one example of a configuration of a grounding circuit according to the fourth example embodiment of the present invention.

Branching unit 507 includes grounding circuit 107 and circuit to be grounded 207.

Grounding circuit 107 is connected between circuit to be grounded 207 and sea earth 347.

Circuit to be grounded 207 is connected to a terminal station A, a terminal station B, and a terminal station C via a cable. Electric power is supplied from the terminal station A, the terminal station B, or the terminal station C to circuit to be grounded 207. Grounding circuit 107 includes relay 115 (RL1), resistor 120, relay 136 (RL2), and relay driving unit 166.

Relay 115 and relay 136 are, for example, a vacuum relay or a gas charging relay.

Control means 150 controls opening and closing of RL1 contact 111 and RL2-1 contact 131 via relay driving unit 166, based on a control signal received from a terminal station via a cable connected to the terminal station, for example. The control signal may be received from circuit to be grounded 207, or may be received from another device via circuit to be grounded 207. As the control signal, a control signal (hereinafter, referred to as a "remote controllable type") received from circuit to be grounded 207 or another device may be used. Alternatively, supplied electric current (hereinafter, referred to as a "supplied electric current controllable type) from circuit to be grounded 207 or another device may be used.

The other configuration of the present example embodiment is the same as the configuration according to the third example embodiment of the present invention.

An operation according to the present example embodiment is described.

Figure 6A:
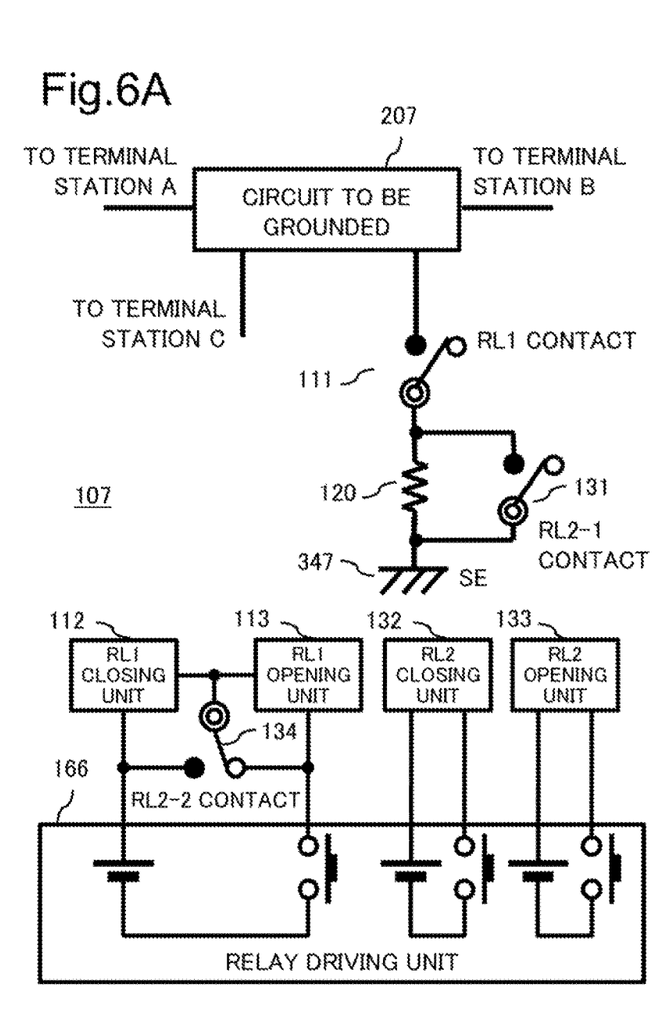
FIG. 6A is a diagram illustrating an operation of the grounding circuit according to the fourth example embodiment of the present invention.
Figure 6B:
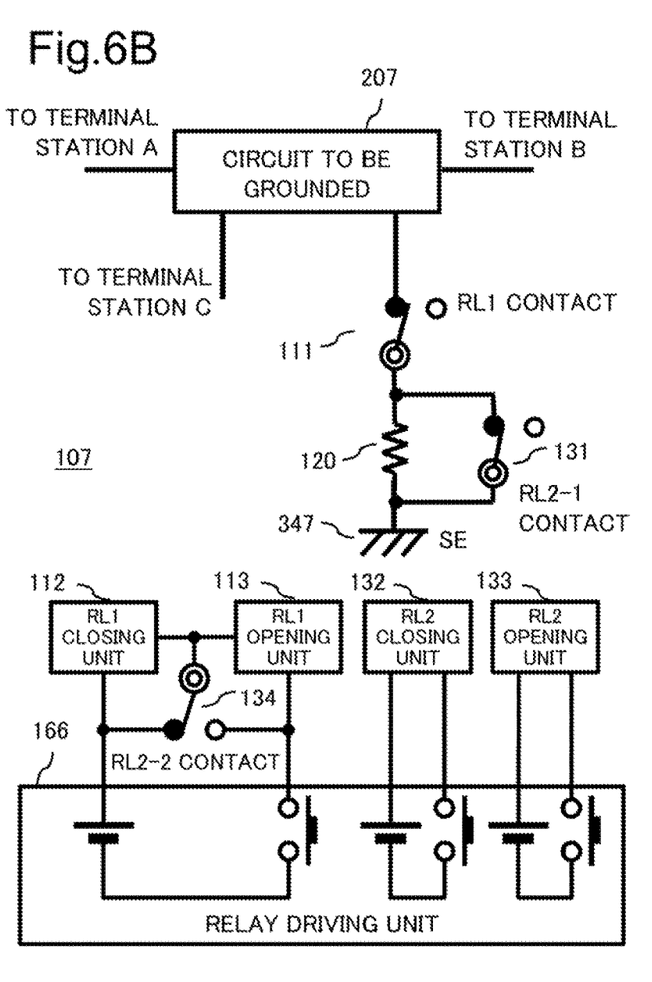
FIG. 6B is a diagram illustrating an operation of the grounding circuit according to the fourth example embodiment of the present invention.

Each of FIGS. 6A and 6B is a diagram illustrating an operation of grounding circuit 107 according to the fourth example embodiment of the present invention. Specifically, FIG. 6A illustrates a state immediately before circuit to be grounded 207 is started to be grounded, and FIG. 6B illustrates a state immediately before circuit to be grounded 207 is started to be ungrounded.

First, an operation in a case of grounding circuit to be grounded 207 is described. It is assumed that an operator operates grounding circuit 107 via relay driving unit 166. Further, the operator may be a control means, a device, a program, or the like included in grounding circuit 107, or may be an external control means, device, program, or the like.

(1) First, the operator supplies electric current to RL2 opening unit 133 via relay driving unit 166. Consequently, grounding circuit 107 opens RL2-1 contact 131, and short-circuits RL1 opening unit 113 by RL2-2 contact 134.

(2) Next, the operator supplies electric current to a circuit where RL1 closing unit 112 and RL1 opening unit 113 are connected in series via relay driving unit 166. Since RL1 opening unit 113 is short-circuited by RL2-2 contact 134, electric current is supplied to RL1 closing unit 112. Consequently, by closing RL1 contact 111, grounding circuit 107 connects circuit to be grounded 207 and sea earth 347 via resistor 120. At this occasion, although large electric current flows through RL1 contact 111 by instantaneous grounding of circuit to be grounded 207 to sea earth 347, the electric current is suppressed by causing the electric current to flow via resistor 120 between sea earth 347 and RL1 contact 111.

(3) Subsequently, the operator supplies electric current to RL2 closing unit 132 via relay driving unit 166, after inflow of large electric current to RL1 contact 111 is terminated. Then, RL2-1 contact 131 is closed, and grounding circuit 107 electrically and directly connects circuit to be grounded 207 and sea earth 347 without intervening resistor 120.

When the operator does not perform the above operation (1) before the above operation (2), RL2-1 contact 131 is in a closed state. However, by RL2-2 contact 134 interlocked with RL2-1 contact 131, RL1 closing unit 112 is short-circuited. Therefore, even when the operator performs the above operation (2), electric current is not supplied to RL1 closing unit 112. Consequently, since RL1 contact 111 is not closed, circuit to be grounded 207 and sea earth 347 are not connected. In other words, even when the operator does not perform the above operation (1) before the above operation (2), there is no likelihood that large electric current flows through RL1 contact 111 by instantaneous grounding of circuit to be grounded 207 to sea earth 347 without intervening resistor 120. In case that RL2-2 contact 134 is not present when RL1 contact 111 is closed without opening RL2-1 contact 131 due to an inadvertent operation of an operator, a program error, or the like, for example, excessive electric current may flow through the two contacts, and the contact may become defective. However, with RL2-2 contact 134 interlocked with RL2-1 contact 131, it is possible to prevent excessive electric current. Specifically, grounding circuit 107 has a fail-safe function regarding an operation of grounding circuit to be grounded 207.

Next, an operation in a case of ungrounding circuit to be grounded 207 is described.

(4) First, when RL2-1 contact 131 is in an opened state for some reason, the operator supplies electric current to RL2 closing unit 132 via relay driving unit 166. Consequently, grounding circuit 107 short-circuits resistor 120 by closing RL2-1 contact 131, and short-circuits RL1 closing unit 112 by RL2-2 contact 134.

(5) Next, the operator supplies electric current to a circuit where RL1 closing unit 112 and RL1 opening unit 113 are connected in series via relay driving unit 166. Since RL1 closing unit 112 is short-circuited by RL2-2 contact 134, electric current is supplied to RL1 opening unit 113. Consequently, grounding circuit 107 opens RL1 contact 111, and circuit to be grounded 207 is ungrounded. At this occasion, when the RL1 contact 111 is in a high voltage state, arc discharge occurs in RL1 contact 111 during opening of RL1 contact 111. However, since RL2-1 contact 131 is in a closed state, a voltage of the RL1 contact 111 is 0V, and arc discharge does not occur in RL1 contact 111. Therefore, a fault is less likely to occur in RL1 contact 111.

When the operator does not perform the above operation (4) before the above operation (5), RL2-1 contact 131 is in an opened state. However, by RL2-2 contact 134 interlocked with RL2-1 contact 131, RL1 opening unit 113 is short-circuited. Therefore, even when the operator performs the above operation (5), electric current is not supplied to RL1 opening unit 113. Consequently, since RL1 contact 111 is not opened, circuit to be grounded 207 is not ungrounded. In other words, even when the operator does not perform the above operation (4) before the above operation (5), arc discharge does not occur in RL1 contact 111. Specifically, grounding circuit 107 has a fail-safe function regarding an operation of ungrounding circuit to be grounded 207.

As described above, grounding circuit 107 according to the present example embodiment includes resistor 120 disposed between RL1 contact 111 and sea earth 347, and RL2-1 contact 131 connected in parallel to resistor 120. Further, when circuit to be grounded 207 is grounded to sea earth 347, electric current flowing through RL1 contact 111 is suppressed by resistor 120. Furthermore, when circuit to be grounded 207 is ungrounded, resistor 120 is short-circuited by RL2-1 contact 131. Since a voltage of RL1 contact 111 becomes 0V, there is no likelihood that a potential difference occurs between RL1 contacts 111 instantaneously when RL1 contact 111 is opened, and arc discharge does not occur in RL1 contact 111. In other words, grounding circuit 107 according to the present example embodiment suppresses, when circuit to be grounded 207 is grounded by connection to the relay contact, electric current flowing through a relay contact, and also suppresses, when circuit to be grounded 207 is ungrounded by disconnection from the relay contact, arc discharge between relay contacts.

Further, in grounding circuit 107 according to the present example embodiment, RL1 opening unit 113 is connected in series to RL1 closing unit 112. Furthermore, when RL2-1 contact 131 is in an opened state, RL2-2 contact 134 short-circuits RL1 opening unit 113. On the other hand, when RL2-1 contact 131 is in a closed state, RL2-2 contact 134 short-circuits RL1 closing unit 112. In other words, since RL1 contact 111 is not closed during closing of RL2-1 contact 131, circuit to be grounded 207 is not grounded. Further, since RL1 contact 111 is not opened during opening of RL2-1 contact 131, circuit to be grounded 207 is not ungrounded. Therefore, grounding circuit 107 according to the present example embodiment has an advantageous effect of having a fail-safe function regarding an operation of grounding circuit to be grounded 207 and an operation of ungrounding circuit to be grounded 207.

Further, as described above, control means 150 may be of a supplied electric current controllable type, or may be of a remote controllable type. In control means 150 of the supplied electric current controllable type, a control signal is limited to supplied electric current. Therefore, when electric power is supplied to circuit to be grounded 207 and grounding circuit 107 from a plurality of (particularly, four or more) external devices, it is not easy to achieve control means 150 of the supplied electric current controllable type. However, in control means 150 of the remote controllable type, a control signal can be defined freely. Therefore, when electric power is supplied to circuit to be grounded 207 and grounding circuit 107 from a plurality of external devices, it is easy to achieve control means 150 of the remote controllable type. Accordingly, when grounding circuit 107 includes control means 150 of the remote controllable type, grounding circuit 107 according to the present example embodiment provides an advantageous effect that it is easy to achieve control means 150 of the remote controllable type, when electric power is supplied to circuit to be grounded 207 and grounding circuit 107 from a plurality of external devices.

Further, a grounding circuit according to each of the example embodiments of the present invention described above may be achieved by a dedicated device. Alternatively, the grounding circuit may be achieved by a computer (information processing device). In this case, the computer outputs an execution result to, for example, a user interface by reading a software program stored in a memory (not illustrated) on a central processing unit (CPU, not illustrated), and causing the CPU to execute the read software program. In a case of the above-described example embodiments, a function of interlocking control unit 140 of grounding circuit 100 illustrated in FIG. 1, a function of control means 150 of grounding circuit 106 illustrated in FIG. 3, or the like described above is only required to be written in the software program in an achievable manner. However, a hardware may be included in control means 150 of grounding circuit 106, as necessary. Further, in such a case, it can be regarded that the software program (computer program) configures the present invention. Furthermore, it can be regarded that a computer readable storage medium storing the software program also configures the present invention.

In the foregoing, the present invention is exemplarily described by the above-described example embodiments and modification examples thereof. The technical scope of the present invention, however, is not limited to the scope described in the above-described example embodiments and modification examples thereof. It is clear that a person skilled in the art can add various changes or improvements to the example embodiments. In such a case, a new example embodiment including the change or improvement can also be included in the technical scope of the present invention. Further, this is clear from the matters described in the claims.

This application claims the priority based on Japanese Patent Application No. 2017-152656 filed on Aug. 7, 2017, the disclosure of which is incorporated herein in its entirety by reference.

INDUSTRIAL APPLICABILITY

The present invention can be used in an application in which a failure at a relay contact for switching the presence or absence of grounding is reduced in an electrical apparatus having a function of switching the presence or absence of grounding. The present invention can be used in an application for controlling grounding in a branching unit, an undersea relay unit, a gain equalization device, an undersea seismometer, or a tsunami meter.

REFERENCE SIGNS LIST 100, 105, 106, 107 Grounding circuit
110, 130, 115, 135, 136 Relay
111, 131, 134 Contact
112, 132 Closing unit
113, 133 Opening unit
120 Resistor
140 Interlocking control unit
150 Control means
160, 166 Relay driving unit
200, 207 Circuit to be grounded
340 Earth
347 Sea earth
500, 505, 506 Electrical apparatus
507 Branching unit

The invention claimed is:

1. A grounding circuit comprising:
a first contact in a first relay connected to a circuit to be grounded;
a resistor connected between the first contact and an earth, and configured to suppress, when the first contact is closed, electric current flowing through the first contact;
a second contact in a second relay connected in parallel to the resistor; and
an interlocking control unit configured to inhibit, when the second contact is in an opened state, opening of the first contact in a closed state, and inhibit, when the second contact is in a closed state, closing of the first contact in an opened state,
wherein
the first contact holds an opened/closed state,
the second contact holds an opened/closed state, and
the interlocking control unit further includes
a first closing unit in the first relay, configured to close the first contact,
a first opening unit in the first relay, connected in series to the first closing unit, and configured to open the first contact, and
a third contact in the second relay, configured to interlock with the second contact, short-circuit, when the second contact is in an opened state, the first opening unit, and short-circuit, when the second contact is in a closed state, the first closing unit.

2. The grounding circuit according to claim 1, wherein the interlocking control unit further includes
a second closing unit in the second relay, configured to close the second contact,
a second opening unit in the second relay, configured to open the second contact, and
a relay driving unit configured to supply electric current and stop supplying electric current to a circuit where the first closing unit and the first opening unit are connected in series, supply electric current and stop supplying electric current to the second closing unit, and supply electric current and stop supplying electric current to the second opening unit.

3. The grounding circuit according to claim 2, wherein the circuit to be grounded is connected to a terminal station by a cable, and opening/closing of the first contact and the second contact is controlled, based on a control signal received from the terminal station via the cable.

4. The grounding circuit according to claim 2, wherein the earth is grounded to sea water.

5. The grounding circuit according to claim 2, wherein each of the first relay and the second relay is a vacuum relay or a gas charging relay.

6. The grounding circuit according to claim 1, wherein the circuit to be grounded is connected to a terminal station by a cable, and opening/closing of the first contact and the second contact is controlled, based on a control signal received from the terminal station via the cable.

7. The grounding circuit according to claim 6, wherein electric power is supplied from the terminal station via the cable.

8. The grounding circuit according to claim 7, wherein the earth is grounded to sea water.

9. The grounding circuit according to claim 7, wherein each of the first relay and the second relay is a vacuum relay or a gas charging relay.

10. The grounding circuit according to claim 6, wherein the earth is grounded to sea water.

11. The grounding circuit according to claim 6, wherein each of the first relay and the second relay is a vacuum relay or a gas charging relay.

12. The grounding circuit according to claim 1, wherein the earth is grounded to sea water.

13. The grounding circuit according to claim 1, wherein each of the first relay and the second relay is a vacuum relay or a gas charging relay.

14. An electrical apparatus comprising:
a circuit to be grounded; and
the grounding circuit according to claim 1.

15. A non-transitory storage medium storing a grounding control program causing a computer provided with a grounding circuit including
a first contact in a first relay, connected to a circuit to be grounded,
a resistor connected between the first contact and an earth, and configured to suppress, when the first contact is closed, electric current flowing through the first contact, and
a second contact in a second relay, connected in parallel to the resistor,
to execute
processing of inhibiting, when the second contact is in an opened state, opening of the first contact in a closed state, and processing of inhibiting, when the second contact is in a closed state, closing of the first contact in an opened state.

* * * * *